(12) United States Patent
Fought et al.

(10) Patent No.: US 6,889,350 B2
(45) Date of Patent: May 3, 2005

(54) METHOD AND APPARATUS FOR TESTING AN I/O BUFFER

(75) Inventors: Eric T. Fought, Chandler, AZ (US); Cass A. Blodgett, Phoenix, AZ (US); Akira Kakizawa, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 09/894,007

(22) Filed: Jun. 29, 2001

(65) Prior Publication Data

US 2003/0005374 A1 Jan. 2, 2003

(51) Int. Cl.[7] ............................................. G06F 11/00
(52) U.S. Cl. ..................................... 714/745; 714/48
(58) Field of Search ............................. 714/745, 733, 714/48

(56) References Cited

U.S. PATENT DOCUMENTS

| | | | | |
|---|---|---|---|---|
| 5,621,739 A | * | 4/1997 | Sine et al. ................... | 714/724 |
| 5,646,948 A | * | 7/1997 | Kobayashi et al. .......... | 714/719 |
| 5,805,601 A | * | 9/1998 | Takeda et al. ............... | 370/505 |
| 5,959,487 A | * | 9/1999 | Kawamura ................... | 327/270 |
| 6,512,707 B2 | * | 1/2003 | Miura et al. ................. | 365/194 |
| 6,566,857 B1 | | 5/2003 | Kakizawa et al. | |
| 6,725,406 B2 | | 4/2004 | Kakizawa et al. | |

OTHER PUBLICATIONS

"Delay Test of Chip I/Os Using LSSD Boundary Scan", Gillis et al., Oct. 18–23, 1998, Test Conference Proceedings 1998, pp 83–90.*

"GTLP16616 17–Bit TTL/GTLP Bus Transceiver With Buffered Clock", Jun. 1997, Spec Sheet, Fairchild Semiconductor.*

U.S. Appl. No. 10/749,629, Swartz et al., pending, not yet published.

* cited by examiner

Primary Examiner—Albert Decady
Assistant Examiner—John P Trimmings
(74) Attorney, Agent, or Firm—Jeffrey B. Huter

(57) ABSTRACT

A buffer circuit is provided having a driver device and an input device to receive a first set of signals and to produce a second set of signals. The driver device may receive the second set of signals and output a third set of signals based on the second set of signals input to said driver device. A comparing device may receive the third set of signals from the driver device and produce a fourth set of signals based on the third set of signals, the comparing device may compare the fourth set of signals with the first set of signals.

16 Claims, 6 Drawing Sheets

METHOD AND APPARATUS FOR TESTING AN I/O BUFFER

FIELD

The present invention is directed to high speed interfaces. More particularly, the present invention is directed to testing high speed interface timings so as to detect defects of a chip.

BACKGROUND

Computing devices and systems may contain components such as chips that contain high speed interfaces. During design of such systems, and prior to distribution to consumers, these interfaces need to be tested to determine their proper functionality. Such testing may be accomplished by using a testing device that couples to the interface, for example, and testing the timing of signals across the interface. However, modern chips may operate at frequencies higher than that of the testing device. It is therefore desirable to have a built-in self test to test these high speed interfaces.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto.

The following represents brief descriptions of the drawings in which like reference numerals represent like elements and wherein.

DETAILED DESCRIPTION

Figure 1:
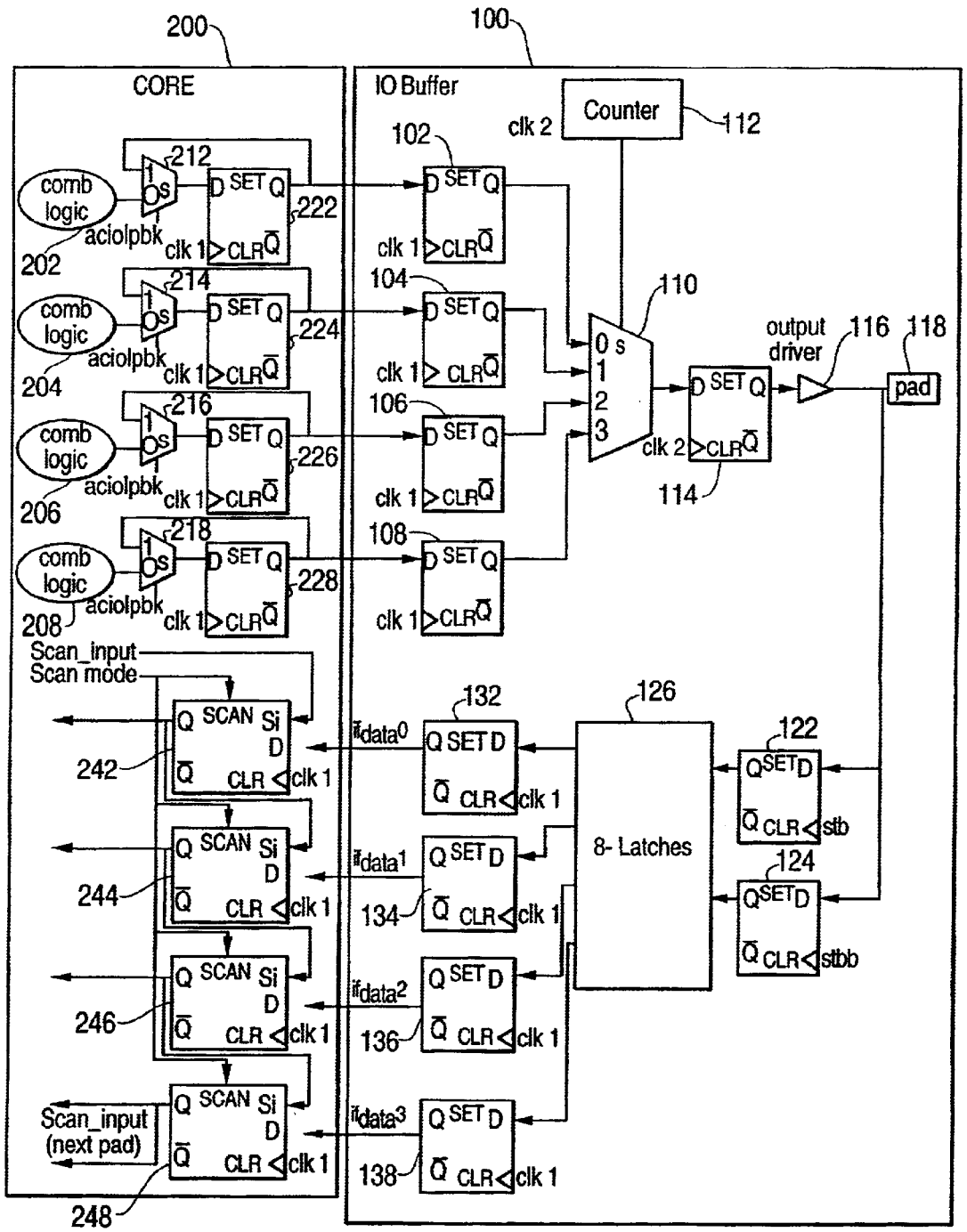
FIG. 1 is an example arrangement showing AC IO loopback for an IO buffer.

In the following detailed description, like reference numerals and characters may be used to designate identical, corresponding or similar components in differing figure drawings. Further, example sizes/models/values/ranges may be given, although the present invention is not limited to these specific examples. The clock and timing signal FIGS. are not drawn to scale, and instead, exemplary time values may be mentioned. With regard to the description of any timing signals, the terms HIGH and LOW may be used in a generic sense. More particularly, such terms may be used to avoid confusion when working with a mixture of "active-low" and "active-high" signals, and to represent the fact that the invention is not limited to the illustrated/described signals, but could be implemented with a total/partial reversal of any of the "active-low" and "active-high" signals by a change in logic. Additionally, well known power/ground connections to integrated circuits (ICs) and other components may not be shown within the FIGS. for simplicity of illustration and discussion, and so as not to obscure the invention. Where specific details (e.g., circuits, flowcharts) are set forth in order to describe example embodiments of the invention, it should be apparent to one skilled in the art that the invention can be practiced without, or with variation of, these specific details. Finally, it should be apparent that differing combinations of hard-wired circuitry can be used to implement embodiments of the present invention. That is, the present invention is not limited to any specific combination of hardware.

Any reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the knowledge of one skilled in the art to effect such feature, structure, or characteristic in connection with other ones of the embodiments.

Embodiments of the present invention relate to the testing of signals and components so as to validate high speed interface timings. Embodiments of the present invention may be used to validate high speed source synchronous buffers by using a high speed tester. A front side bus buffer may include quad pumped 133 MHz buffers with a data rate of 533 MHz. However, a tester device such as an S9K tester may have a maximum frequency of 156 MHz. The testing device therefore operates slower than the fast speed buffers thereby making it difficult to test the higher speed interfaces.

AC IO loopback is one method of using a lower speed testing device to test higher speed buffers. AC IO loopback involves the transfer of external data into a chip and looping that data internally within the chip. Strobe signals may be used as clock signals to determine if the chip passes or fails the desired timings. This type of method and structure may use scan chains to load data into outbound flip-flop circuits. Once the data is loaded into the flip-flop circuits, it may be transmitted through the IO buffer and captured on the inbound paths. The captured strobes may be delayed in predetermined increments. The idea is to find the point at which one path (i.e., one IO buffer) fails and a second point when all paths fail. A difference between the first failure condition and the second failure condition may be measured. The calculated value (delta T) may be compared with an acceptable value. If the delta T is within an acceptable range, the part is considered good. On the other hand, if the delta T is too large, then the part may be defective.

FIG. 1 illustrates an example arrangement showing AC IO loopback for an IO buffer. Other arrangements for AC IO loopback are also possible. More particularly, FIG. 1 shows an IO buffer 100 and a core 200 that are provided within a chip. This chip includes the AC IO loopback structure for testing at least an output driver circuit 116.

The core 200 may include multiplexors 212, 214, 216 and 218 that are coupled to combinational logic 202, 204, 206 and 208. The combinational logic 202, 204, 206 and 208 provides functional components that may be used to perform various operating functions of the chip when the chip is under normal operation (i.e., not undergoing testing). This path may also be used to test at lower frequencies. The multiplexors 212, 214, 216 and 218 may be clocked by the signal aciolpbk and provide an output signal to a corresponding one of the D flip-flop circuits 222, 224, 226 and 228. The D flip-flop circuits 222, 224, 226, and 228 may be loaded with IO data for the testing. Output signals from the D flip-flop circuits 222, 224, 226 and 228 may be fed back to another input of the multiplexors 212, 214, 216 and 218. In the IO buffer 100, output signals of the D flip-flop circuits 222, 224, 226 and 228 are also input to D flip-flop circuits 102, 104, 106 and 108 of the IO buffer 100. Output signals of the D flip-flop circuits 102, 104, 106 and 108 are input to 0, 1, 2, and 3 inputs, respectively, of a multiplexor 110. The multiplexor 110 may be incremented by a counter 112 and output a signal to a D flip-flop circuit 114. The signal output from the D flip-flop circuit 114 is input to the output driver circuit 116, which in turn outputs a signal to a pad 118. The pad 118 may correspond to a pin of the chip. The signal output from the output driver circuit 116 may also be input to a D flip-flop circuit 122 and to a D flip-flop circuit 124. Signals output from the D flip-flop circuit 122 and the D flip-flop circuit 124 are input to an 8-latch circuit 126. The 8-latch circuit 126 outputs signals to each of the D flip-flop circuits 132, 134, 136 and 138. The signals (ifdata0, ifdata1, ifdata2 and ifdata3) output from the D flip-flop circuits 132, 134, 136 and 138 are input to D inputs of the D flip-flop circuits 242, 244, 246 and 248, respectively. A Q output signal of the D flip-flop circuit 242 is input to the Si input of the D flip-flop circuit 244. A Q output signal of the D flip-flop circuit 244 is input to the Si input of the D flip-flop circuit 246. Additionally, a Q output of the D flip-flop circuit 246 is input to the Si input of the D flip-flop circuit 248. A Q output of the D flip-flop circuit 248 is shown as signal scan_input (next pad). This output signal scan_input (next pad) may be used to determine a delta T value. That is, the signal scan_input (next pad) may be observed externally so that the delta T value may be calculated. The delta T value is used by a testing device to determine if the timing of the signals are within an acceptable range (i.e., whether the circuit is defective).

More generally speaking, in AC IO loopback the outbound D flip-flop circuits 222, 224, 226 and 228 in the core 200 may have their output signals fed back to the multiplexers 212, 214, 216 and 218. This re-circulates the data during the AC IO loopback testing mode. The desired data may be scanned into the outbound D flip-flop circuits 222, 224, 226 and 228 and retained by asserting the signal aciolpbk that is applied to the multiplexors 212, 214, 216 and 218.

FIG. 1 further shows that a signal clk1 is used as a clock input to the D flip-flop circuits 102, 104, 106 and 108, the D flip-flop circuits 132, 134, 136 and 138 and the D flip-flop circuits 242, 244, 246 and 248. A signal clk2 may be used as a clock input to the counter 112 and the D flip-flop circuit 114. In one example arrangement, the signal clk1 may be a 100 MHz clock signal and the signal clk2 may be a 400 MHz clock signal. Other arrangements for the clock input frequency are also possible. The use of a 100 MHz clock signal and a 400 MHz clock signal allows 4 pieces of data to be input for every 100 MHz clock cycle. Stated differently, the IO test data comes into the chip at 100 MHz and gets tested at 400 MHz. Based on operations of the D flip-flop circuits, the multiplexors and the clock signals, the data inputs to the D flip-flop circuits 222, 224, 226 and 228 may pass through the output driver circuit 116 and may be captured by the inbound D flip-flop circuits 122 and 124. This is the loopback of the data from the output driver circuit 116 to the D flip-flop circuits 122 and 124. The D flip-flop circuits 122 and 124 may be clocked by the strobe signals stb and stbb, which may operate at 200 MHz to capture the data. Once all four signals (corresponding to that originally provided within the D flip-flop circuits 222, 224, 226 and 228) have been captured in the 8-latch circuit 126, the data may be transmitted to the inbound D flip-flop circuits 132, 134, 136 and 138. The next clock edge of the signal clk1 may load the data into the core 200. That is, the D flip-flop circuits 132, 134, 136, and 138 bring the data back to operating at 100 MHz. At this point, the scan load enable (loaden) signal may be asserted and the data may be shifted out. That is, data may be shifted out from the D flip-flop circuit 248 as the signal scan_input(next pad). This signal scan_input (next pad) may be compared against the original data that was loaded into the D flip-flop circuits 222, 224, 226 and 228. The signal scan_input (next pad) may be used to determine whether a defect occurs within the chip and, more particularly, whether a defect occurs within the output driver circuit 116. That is, the signal scan_input (next pad) may be observed externally to determine whether a defect occurs.

Embodiments of the present invention may improve upon the AC IO loopback arrangement shown in FIG. 1 by reducing the amount of time to generate the patterns of data. The amount of test time may be dramatically reduced by utilizing embodiments of the present invention. In order to better illustrate this, embodiments of the present invention may be described with respect to an IO Buffer BIST (built-in self test) that may be implemented on a chip having source synchronous buffers, although embodiments of the present invention are also applicable to other types of buffers and chips.

Figure 2:
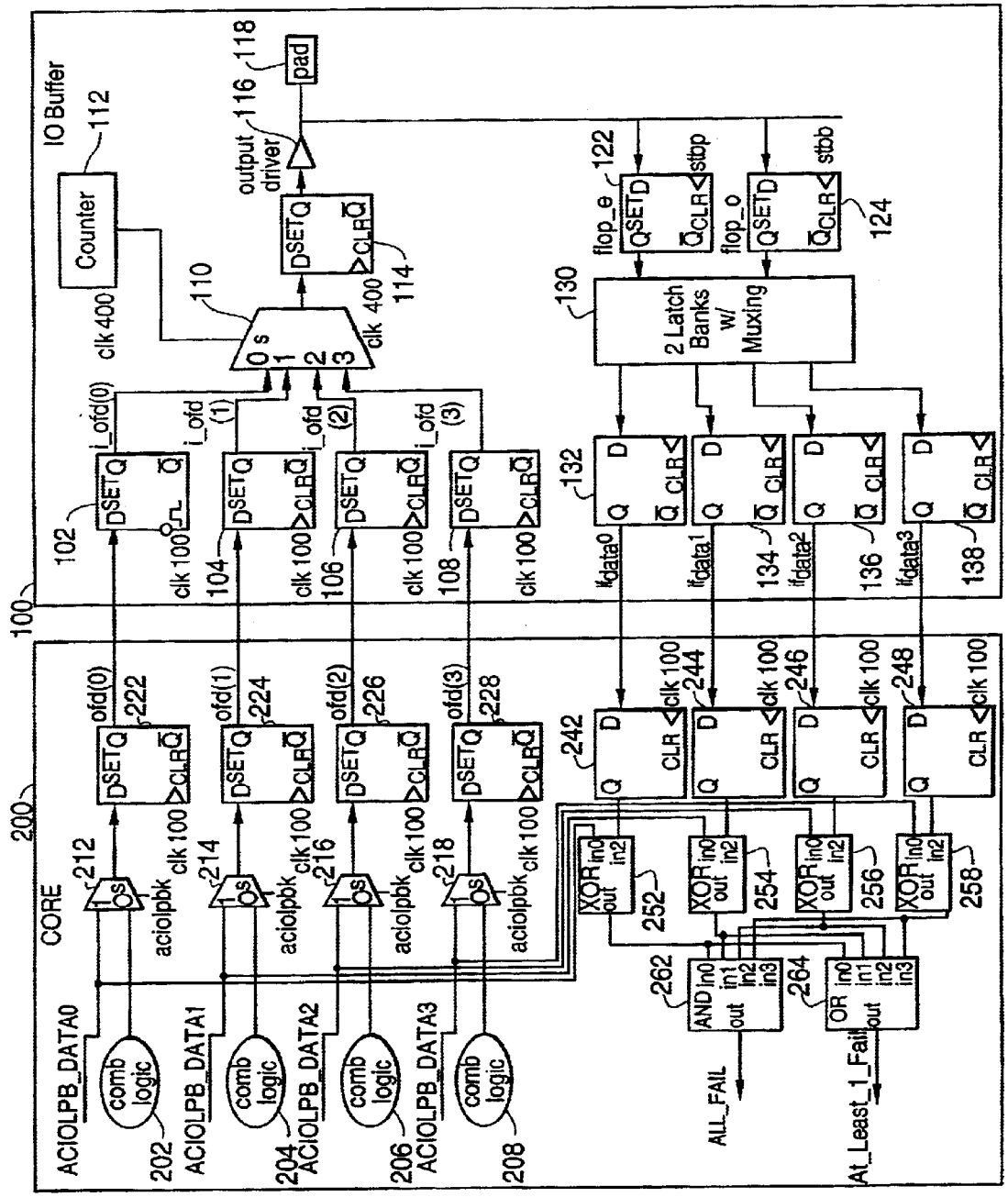
FIG. 2 illustrates a structure for a built-in self test of an IO buffer according to an example embodiment of the present invention.

FIG. 2 illustrates a structure for a built-in self tester (BIST) of an IO buffer according to an example embodiment of the present invention. Other embodiments and configurations are also within the scope of the present invention. Further, embodiments of the present invention will be described with respect to D flip-flop circuits, multiplexors, XOR circuits, AND circuits and OR circuits. One skilled in the art would understand that other combinations or types of logic circuits or types of flip-flop circuits may be used to obtain the desired functionality.

In order to avoid repetitive description, similar components in FIG. 2 and FIG. 1 may not be described again as their interconnections and operations have already been described or would be understandable to one skilled in the art. FIG. 2 shows that the inputs to the multiplexors 212, 214, 216 and 218 (that feed the outbound D flip-flop circuits 222, 224, 226 and 228) are loaded via an ACIOLPB_data (3:0) bus. For example, the signal ACIOLPB_data0 may be input to the multiplexor 212, the signal ACIOLPB_data1 may be input to the multiplexor 214, the signal ACIOLPB_data2 may be input to the multiplexor 216 and the signal ACIOLPB_data3 may be input to the multiplexor 218. Accordingly, the chip (and more particularly the IO Buffer BIST) may be programmed with data that is loaded into the outbound D flip-flop circuits 222, 224, 226 and 228 via the ACIOLPB_data bus.

FIG. 2 further shows XOR circuits 252, 254, 256 and 258 provided within the core 200. Unlike the FIG. 1 arrangement, the input signals on the ACIOLPB data bus are input to XOR circuits 252, 254, 256 and 258 for testing as will be described. More specifically, the signal ACIOLPB_data0 is input to an in0 input of the XOR circuit 252 and a Q output from the D flip-flop circuit 242 is input to an in2 input of the XOR circuit 252. The signal ACIOLPB_data1 is input to an in0 input of the XOR circuit 254 and a Q output from the D flip-flop circuit 244 is input to an in2 input of the XOR circuit 254. The signal ACIOLPB_data2 is input to an in0 input of the XOR circuit 256 and a Q̄ output from the D flip-flip circuit 246 is input to an in2 input of the XOR circuit 256. Finally, the signal ACIOLPB_data3 is input to an in0 input of the XOR circuit 258 and a Q output from the D flip-flop circuit 248 is input to an in2 input of the XOR circuit 258.

Signals output from each of the XOR circuits 252, 254, 256 and 258 are input to an AND circuit 262 that provides an output signal ALL_FAIL if all of its inputs are HIGH. That is, a high output signal from the AND circuit 262 corresponds to an all fail condition. Similarly, the signals output from each of the XOR circuits 252, 254, 256 and 258 are input to an OR circuit 264 that provides an output signal At_Least_1_Fail if at least one of the input signals to the OR circuit 264 is HIGH. That is, a HIGH output signal from the OR circuit 264 corresponds to the at least one fail condition. In accordance with embodiments of the present invention, the signal ALL_FAIL and the signal At_Least_1_Fail may be used to determine the delta T value for the circuit and thereby determine if the IO buffer 100, including the output driver circuit 116, is defective. That is, a delta T value may be determined and compared against an acceptable delta T value. In these embodiments, delta T may be a time difference between the at least one fail condition and an all fail condition.

As shown in FIG. 2, the D flip-flop circuits 122 and 124 may be clocked by the strobe signal stbp and the strobe signal stbn, respectively. The output signals flop_e and flop_o are input to a 2-latch bank with mixing circuit 130 (similar to the 8-latch circuit 126 shown in FIG. 1). Each bank within the circuit 130 has 4 latches. Embodiments of the present invention may skew or delay the strobe signals stbp and stbn by increments to capture and test the next data.

Figure 3:
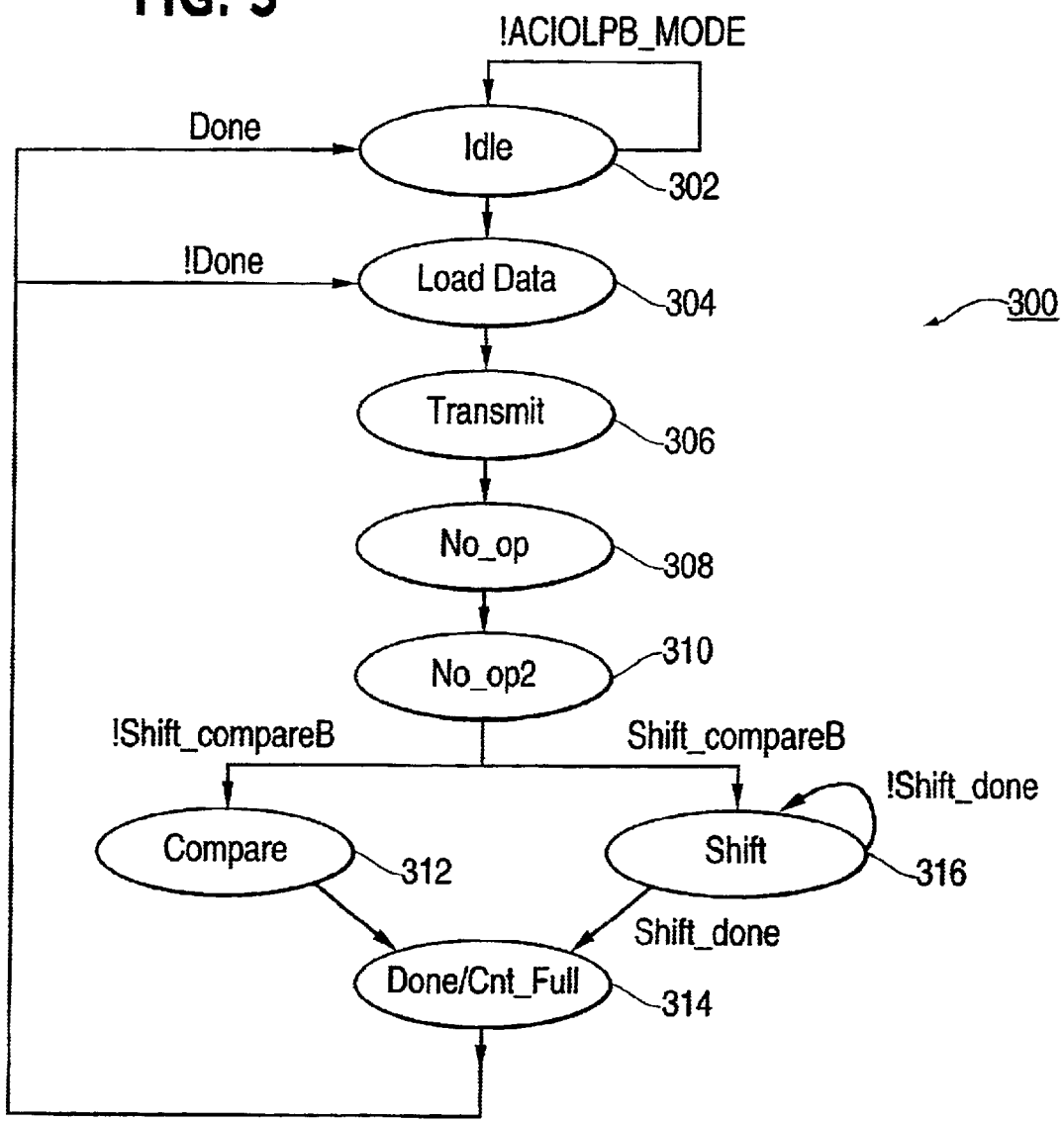
FIG. 3 illustrates modes of a state machine according to an example embodiment of the present invention.

In order to operate the circuit shown in FIG. 2, the chip may include a state machine and other combinational logic to control operations of the IO Buffer BIST. FIG. 3 shows a flow chart 300 that represents operations of the state machine. Other operations and types of state machines are also within the scope of the present invention. As shown in FIG. 3, the state machine may remain in an Idle state 302 until the chip enters a testing mode. At this point, the state machine may transition to a Load Data state 304 to allow the transmit data to propagate to the pads. As discussed above, the input data may be programmed into the chip on the ACIOLPBK_data (3:0) bus that is coupled to the multiplexors 212, 214, 216 and 218 (FIG. 2). The state machine may transition to a Transmit mode that causes data transmission. That is, the transmit signal may be active for 1 cycle. For example, as shown in FIG. 2, the data may be transmitted across the D flip-flop circuits 222, 224, 226 and 228, the D flip-flop circuits 102, 104, 106, 108, the multiplexor 110, the D flip-flop circuit 114 and through the output driver circuit 116 where it may be captured by the inbound D flip-flop circuits 122 and 124. As shown in FIG. 3, the state machine may enter a No_Op (no operation) state 308 and a No_Op 2 (no operation) state 310. The No-op State 308 allows for the flip-flop delay in the pad. The No-op State 310 allows for the flip-flop delay in the core 200. These states may represent the flip-flop delays in the IO buffer 100 and the core 200 (corresponding to the D flip-flop circuits 132, 134, 136 and 138 and the D flip-flop circuits 242, 244, 246 and 248). There is no limit to the number of No_op states. That is, the number may be design specific.

Once the data has been captured in the inbound D flip-flop circuits 242, 244, 246 and 248, the data may be compared with the original data using the XOR circuits 252, 254, 256 and 258. This may occur in the Compare state 312. On the other hand, if the chip is being debugged, then the state machine may enter a Shift mode 316 to scan out data. This selection of the modes 312 and 316 may be accomplished by using a test register that controls the next state selection (between the Compare mode 312 and the Shift mode 316). If in the Shift mode 316, the chip may operate to shift (or clock) the data until all the data may be shifted out through the scan chain. The state machine may remain in the Shift mode until a shift_done signal is asserted.

Once this Shift mode 316 or the Compare mode 312 have been completed, the state machine may enter a Done/Control_Full state 314 in which pass/fail flags may be generated depending on the inputs from the units. This state may be used to determine if the Buffer BIST sequence is complete in which case the state machine may return to the Idle state 302. On the other hand, if the Buffer BIST sequence is not complete, then the state machine may increment the strobe delay and enter the Load Data state 304. If the ALL_FAIL condition occurs and the expected strobe (i.e, the expected strobe is determined by characterization and may be programmed into the test register) matches the current strobe count, then a pass_flag may be asserted. Otherwise, the state machine may continue counting. This loop of the flow chart 300 may continue until a pass_flag is asserted or the maximum strobe count is reached.

In order to use the Buffer BIST, an acceptable delta T (or window) value is calculated. This delta T (or window) value may be the amount of time between the at least one fail condition and the all fail condition. By sampling a number of chips, a delta T value may be calculated. Calculating the delta T value for circuit components may be an automated process by using the above described Buffer BIST. That is, the state machine may loop through the various testing modes until the all_fail condition is obtained. The delta T value may be determined by counting the number of cycles or loops from when the At_Least_1_Fail flag is asserted to when the All_Fail flag is asserted. Another method to determine an acceptable delta T value may be accomplished with timing specifications of a particular interface or IO buffer.

The calculation to properly characterize (i.e., determine an acceptable delta T value) a chip component using this testing mode will now be described. Initially, the chip may be reset. The test registers may be loaded with the ACIOLPBK data, starting with the strobe delay and the test mode enable bit. The state machine may then send the ACIOLPBK data to the outbound D flip-flop circuits 222, 224, 226 and 228. The data may then be transmitted which requires that the strobe pads that generate the strobes with the proper delay is specified by the testing unit. The data may be captured by the D flip-flop circuits 222, 224, 226 and 228. This data may be compared with the original data using the XOR circuits 252, 254, 256, 258, the AND circuit 262 and the OR circuit 264 to generate the All_Fail signal and the At_Least_1_Fail signal. The state machine may then determine whether the test mode is complete by monitoring the All_Fail flag. If the flag is not asserted, then the strobe delay may be incremented and the process may be repeated. However, this time the ACIOLPBK data may be inverted. This may continue until either the All_Fail flag is asserted or the maximum strobe delay has been reached. If the All_Fail flag is asserted, then the test is complete. On the other hand, if the All_Fail flag is not asserted within the specified delta T, then the chip may be defective.

Figure 4:
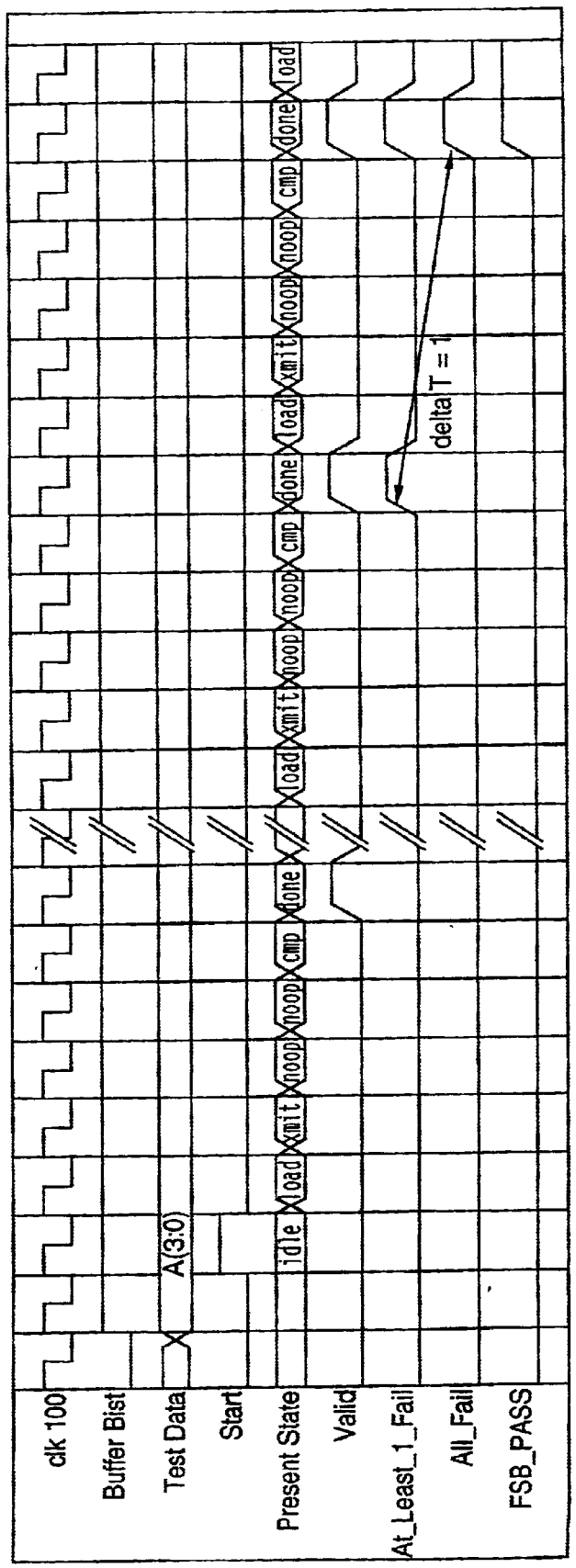
FIG. 4 is a timing diagram according to an example embodiment of the present invention.

FIG. 4 is a timing diagram showing the timing of various signals (of FIG. 2) according to an example embodiment of the present invention. Most particularly, FIG. 4 shows the signal clk 100 that operates at 100 MHz. The line labeled "Present State" corresponds to the various modes (i.e., Idle State 302, Load State 304, Transmit State 306, No__Op State 308, No__Op State 310, Compare State 312, Done State 314 and Shift State 316) of the state machine that controls the IO Buffer BIST. FIG. 4 further shows that a first fail condition (i.e., the signal At__Least__1__Fail) occurs during a second cycle of the state machine. The delta T value is determined based on the time separation between the HIGH state of the signal At__Least__1__Fail and the HIGH state of the signal All__Fail. The testing device that couples to the chip determines this delta T value and compares it with a predetermined standard to determine if the chip is defective or not.

Figure 5:
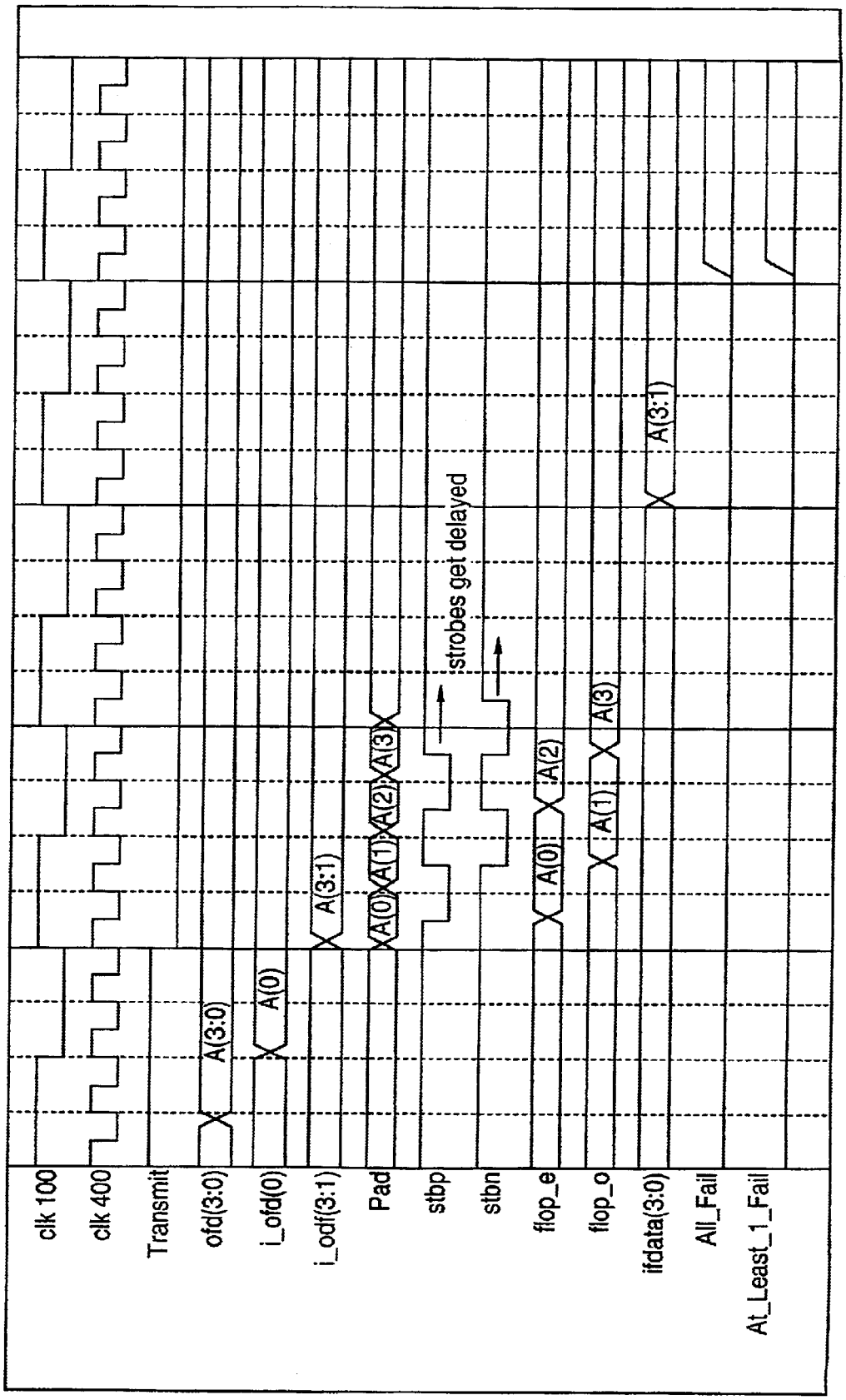
FIG. 5 is a timing diagram according to an example embodiment of the present invention.

FIG. 5 is a more detailed timing diagram than FIG. 4. More specifically, FIG. 5 shows the signal clk 100 operating at 100 MHz and the signal clk 400 operating at 400 MHz. This figure further shows the signal stbp and the signal stbn that clock the D flip-flop circuits 122 and 124, respectively. The figure further shows the strobe signals stbp and stbn being delayed.

Figure 6:
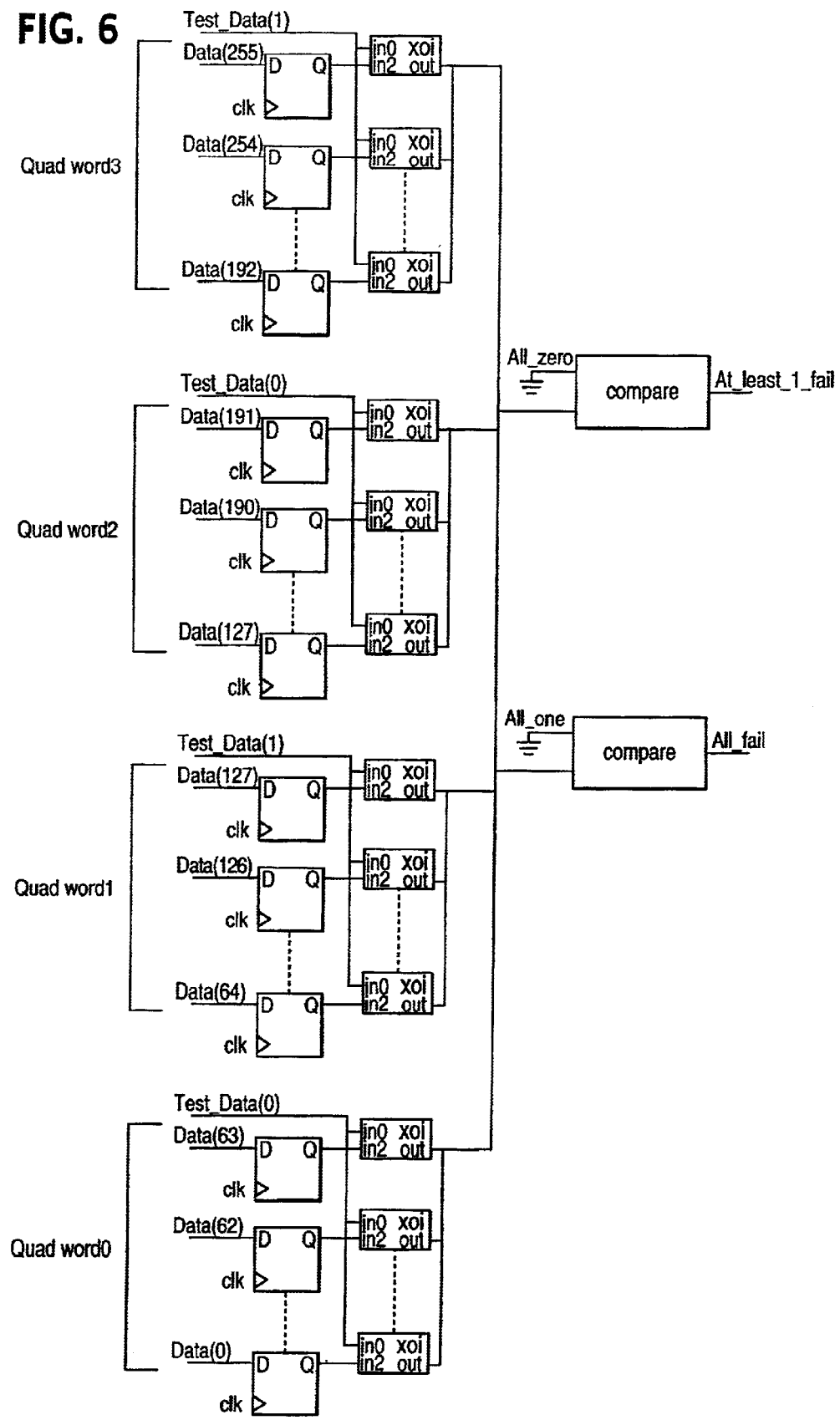
FIG. 6 illustrates the testing of a full chip according to an example embodiment of the present invention.

FIG. 6 illustrates a front side bus that may include 64 buffers each similar to that shown in FIG. 2. In this example, data may be loaded into the testing device by a 128 bit shift register. That is, only two bits of the 128 bit register are used for IO BUFFER BIST data. To generate the At__Least__1__ Fail flag for the front side bus data, a 256×1 OR gate is used. The output of each XOR gate is OR'd together thereby generating the At__Least__1__Fail flag. To generate the All__Fail__Flag for the front side bus, a 256×1 AND gate may be used. The output of each XOR gate is AND'd together thereby generating the All__Fail flag.

FIG. 6 shows the logic to support the IO Buffer BIST for the front side bus data pads. All of the D flip-flop circuits are provided in the design and the comparators (i.e., XOR circuits) and two large comparators are used. There are only two bits of test data because the only patterns for the 4× path are 0101 and 1010.

As may be seen from the above discussion, embodiments of the present invention may improve on an AC IO loopback structure by internally generating the data as compared to loading the data into the flip-flop circuits. This saves a significant amount of tester time. The XOR circuits 252, 254, 256, and 258 may be coupled to receive the input data and perform the necessary comparisons internally within the chip. That is, the At_least__1__Fail signal and the All__Fail signal may be generated by the OR circuit 264 and the AND circuit 262 respectively. Accordingly, the external testing device does not need to load the test data into the chip and subsequently perform the comparison. The data may be loaded internally, the comparison may be done internally and the results may be fed out through pins of the chip.

Accordingly, the embodiments of the present invention may utilize a Buffer BIST that makes testing of high speed interfaces more bearable. For example, the testing mode may be run on slow testing devices. The tested time may be dramatically reduced.

This concludes the description of the example embodiments. Although the present invention has been described with reference to a number of illustrative embodiments thereof, it should be understood that numerous other modifications and embodiments can be devised by those skilled in the art that will fall within the spirit and scope of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses may also be apparent to those skilled in the art.

What is claimed is:

1. A method of testing a buffer circuit comprising
    driving data signals representative of bits from the buffer circuit in response to a clock signal,
    latching the driven data signals in the buffer circuit in response to a strobe signal having a delay relative to the clock signal,
    generating a first signal in response to detecting that at least one latched data signal fails to represent its corresponding bit of the buffer circuit,
    generating a second signal in response to detecting that all latched data signals fail to represent their corresponding bits of the buffer circuit, and
    determining that the buffer circuit is operational by generating a pass signal in response to a difference between the delay of the strobe signal associated with the first signal and the delay of the strobe signal associated with the second signal being indicative of an improper strobe window.

2. The method of claim 1 further comprising repeatedly adjusting the delay of the strobe signal, driving data signals from the buffer circuit, and latching driven data signals in the buffer circuit until the first signal and the second signal are generated.

3. The method of claim 1 further comprising repeatedly adjusting the delay of the strobe signal, driving data signals from the buffer circuit, and latching driven data signals in the buffer circuit until the first signal and the second signal are generated or the delay of the strobe signal satisfies criteria associated with failed operation.

4. The method of claim 1 further comprising repeatedly adjusting the delay of the strobe signal and the bits driven from the buffer circuit until the first signal and the second signal are generated or the delay of the strobe signal satisfies criteria associated with failed operation.

5. The method of claim 1 wherein the strobe signal operates at a different frequency than the clock signal.

6. The method of claim 1 comprising generating a fail signal in response to a difference between the delay of the strobe signal associated with the first signal and the delay of the strobe signal associated with the second signal being indicative of an improper strobe window.

7. An integrated circuit comprising
    a driver circuit to drive a plurality of bits from a first storage circuit in response to a clock signal,
    a second storage circuit to latch the plurality of bits in response to a strobe signal that is delayed relative to the clock signal;
    a comparing circuit to generate a first signal in response to detecting that at least one bit of the first storage circuit differs from its corresponding bit of the second storage circuit and to generate a second signal in response to detecting that all bits of the first storage circuit differ from their corresponding bits of the second storage circuit, and
    a control circuit to generate a fail signal if the first signal and the second signal are not generated prior to the delay of the strobe signal having a defined relationship to a limit.

8. The integrated circuit of claim 7 wherein the control circuit is to adjust the delay of the strobe signal, and the comparing circuit is to generate the first signal and the second signal based upon the adjusted delay of the strobe signal.

9. The integrated circuit of claim 7 wherein the control circuit is to adjust the delay of the strobe signal and is to adjust the plurality of bits, and the comparing circuit is to generate the first signal and the second signal based upon the adjusted delay of the strobe signal and the adjusted plurality of bits.

10. The integrated circuit of claim 7 wherein the driver circuit is to drive the plurality of bits from the first storage circuit at a first frequency in response to the clock signal which has the first frequency, and a second storage circuit to latch the plurality of bits at the first frequency in response to the strobe signal that has a second frequency that is different than the first frequency.

11. The integrated circuit of claim 7 wherein the control circuit is to generate a pass signal in response to a difference between the delay of the strobe signal associated with the first signal and the delay of the strobe signal associated with the second signal being indicative of a proper strobe window.

12. The integrated circuit of claim 7 wherein the control circuit is to generate a fail signal in response to a difference between the delay of the strobe signal associated with the first signal and the delay of the strobe signal associated with the second signal being indicative of an improper strobe window.

13. A system comprising an integrated circuit to drive a plurality of bits in response to a clock signal, to latch the plurality of bits in response to a strobe signal that is delayed relative to the clock signal, and to generate a status signal based upon a strobe window defined by a first delay of the strobe signal associated with at least one latched bit differing from its corresponding driven bit and a second delay of the strobe signal associated with all latched bits differing from their corresponding driven bits, and a tester coupled to the integrated circuit, the tester to determine whether the integrated circuit is operational based upon the status signal indicating a pass status in response to a difference between the delay of the strobe signal associated with at least one latched bit differing from its corresponding driven bit and the delay of the strobe signal associated with all latched bits differ from their corresponding driven bits being indicative of a proper strobe window.

14. The system of claim 13 wherein the integrated circuit is to adjust the delay of the strobe signal, is to detect based upon the adjusted delay of the strobe signal whether at least one latched bit differing from its corresponding driven bit and whether all latched bits differ from their corresponding driven bits.

15. The system of claim 13 wherein the integrated circuit is to adjust the delay of the strobe signal, is to adjust the plurality of bits, and is to detect based upon the adjusted delay of the strobe signal and the adjusted plurality of bits whether at least one latched bit differing from its corresponding driven bit and whether all latched bits differ from their corresponding driven bits.

16. The system of claim 13 wherein integrated circuit is to generate the status signal to indicate a fail status in response to a difference between the delay of the strobe signal associated with at least one latched bit differing from its corresponding driven bit and the delay of the strobe signal associated with all latched bits differ from their corresponding driven bits being indicative of an improper strobe window.

\* \* \* \* \*